United States Patent [19]

Suzuki et al.

[11] Patent Number: 4,546,327
[45] Date of Patent: Oct. 8, 1985

[54] ANALOG SIGNAL POWER AMPLIFIER CIRCUIT

[75] Inventors: Yasoji Suzuki, Yokosuka; Itsuo Sasaki; Shouji Abou, both of Kawasaki, all of Japan

[73] Assignee: Tokyo Shibaura Denki Kabushiki Kaisha, Kawasaki, Japan

[21] Appl. No.: 513,308

[22] Filed: Jul. 13, 1983

[30] Foreign Application Priority Data

Jul. 14, 1982 [JP] Japan ................. 57-122482

[51] Int. Cl.[4] .............................. H03F 3/45
[52] U.S. Cl. ...................... 330/253; 330/51; 330/260; 330/261; 330/300; 330/307
[58] Field of Search ............... 330/51, 253, 260, 261, 330/300, 307

[56] References Cited

U.S. PATENT DOCUMENTS 4,060,770 11/1977 Schade, Jr. ................. 330/253
4,078,206 3/1978 Crowle .................... 330/300 X
4,334,196 6/1982 Schade, Jr. ................. 330/253
4,345,213 8/1982 Schade, Jr. ................. 330/253
4,360,785 11/1982 Schade, Jr. ................. 330/253 X
4,366,442 12/1982 Yamada ..................... 330/51
4,366,444 12/1982 Schade, Jr. ................. 330/253 X

OTHER PUBLICATIONS

Japanese Patent Disclosure (Kokai) No. 50-98756, Disclosed Aug. 6, 1975.
Japanese Patent Disclosure (Kokai) No. 51-123038, Disclosed Oct. 27, 1976.

Primary Examiner—James B. Mullins
Attorney, Agent, or Firm—Finnegan, Henderson, Farabow, Garrett & Dunner

[57] ABSTRACT

A signal corresponding to an analog input signal is supplied to one of two input terminals of a two-input, one-output MOS differential amplifier. A reference voltage signal is supplied to the other of the two input terminals of the MOS differential amplifier. A bipolar transistor having one end connected to an analog signal output terminal is driven by a signal from the output terminal of the MOS differential amplifier. A loudspeaker is driven by the bipolar transistor.

3 Claims, 27 Drawing Figures

F I G. 1
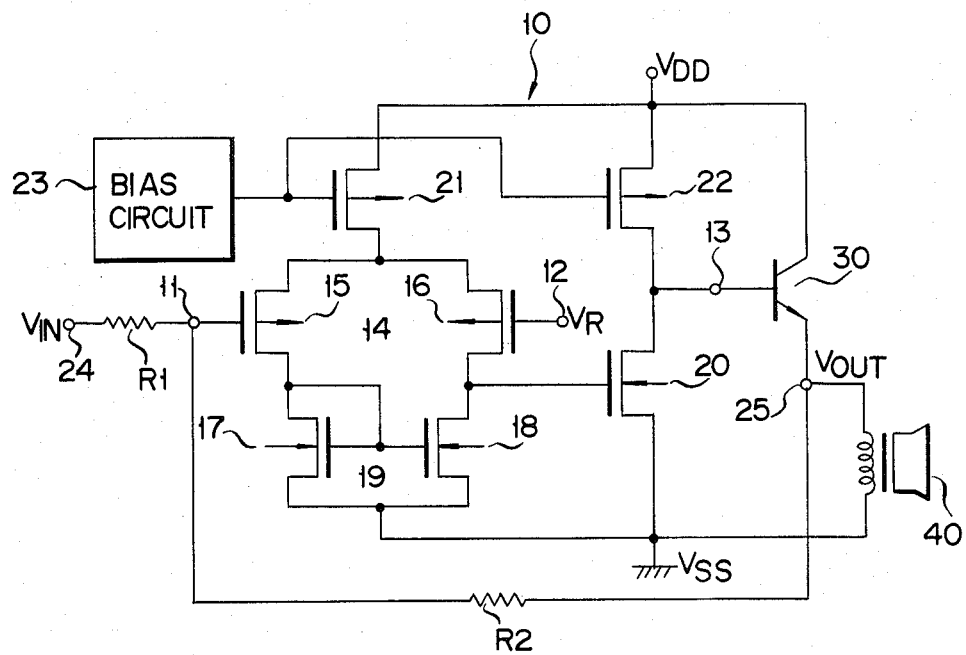
F I G. 2
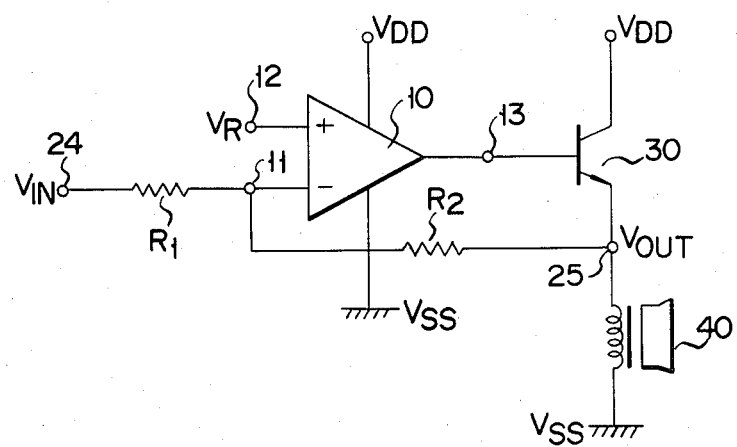

F I G. 3
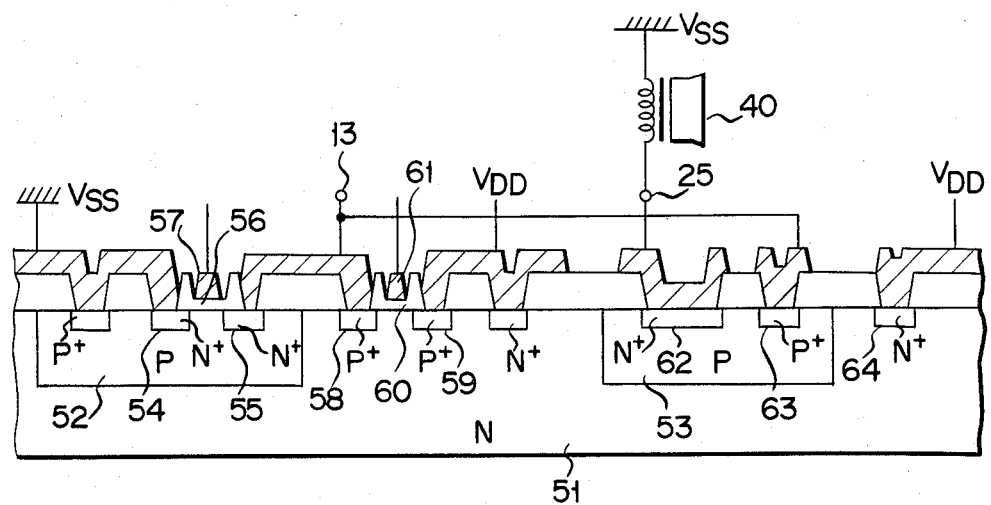
F I G. 4A
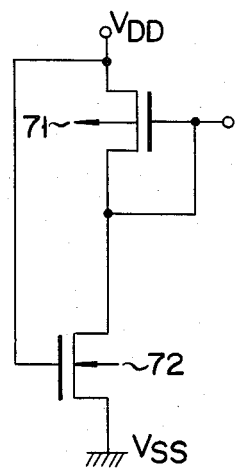
F I G. 4B
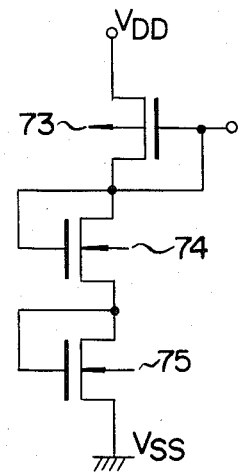

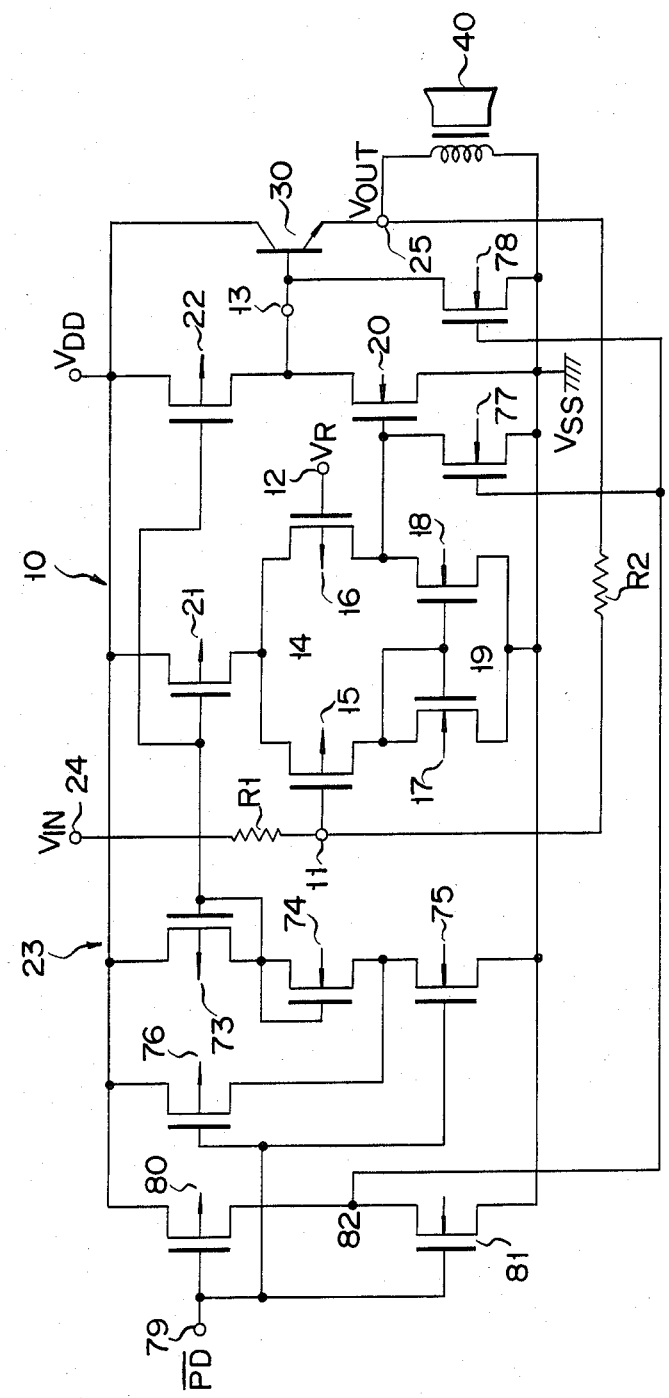
F I G. 13

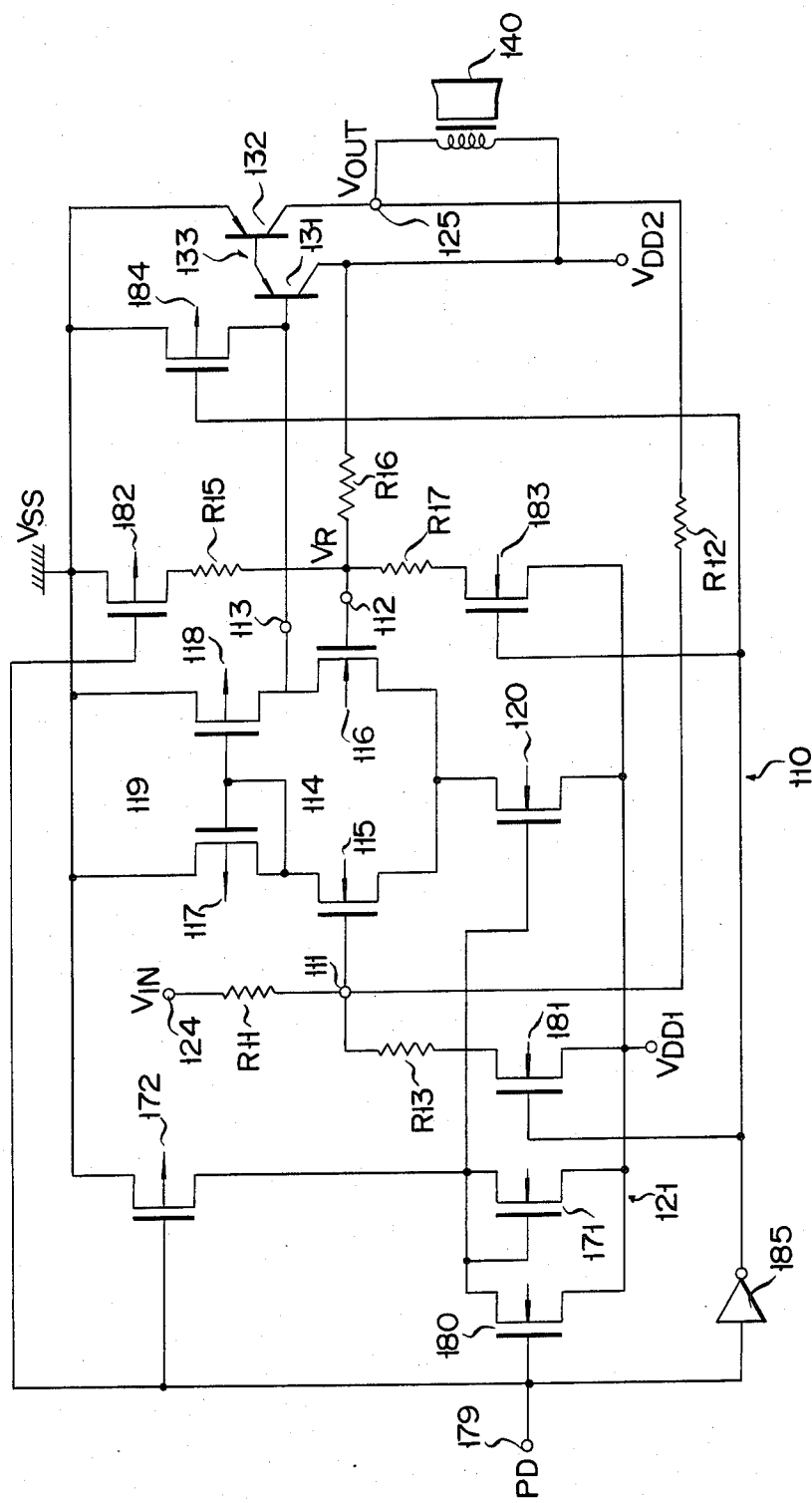

ANALOG SIGNAL POWER AMPLIFIER CIRCUIT

BACKGROUND OF THE INVENTION

This invention relates to an analog signal power amplifier circuit for amplifying an analog signal, especially a speech signal for driving a loudspeaker.

Speech synthesizer integrated circuits using digital signal processing techniques have been recently developed and are now commercially available. An integrated circuit for speech synthesis comprises CMOS transistors which entail a number of circuit elements. For this reason, in order to produce a large analog output current, the element dimensions at the output stage are greatly increased, thereby increasing chip size.

A speech synthesizer IC has been developed wherein an amplifier circuit thereof comprises a gain stage of MOS transistors and an output stage of a bipolar transistor. The bipolar transistor allows a large current to flow therethrough while being small in size. The circuit of this type is disclosed in Japanese Patent Publication (Kokai) No. 50-98756. However, since a CMOS inverter is used in the gain stage of this circuit, the operating point varies in accordance with a change in threshold of the CMOS inverter, thereby greatly varying the dynamic range of the output signal.

SUMMARY OF THE INVENTION

It is, therefore, an object of the present invention to provide an analog signal power amplifier circuit wherein chip area can be decreased during circuit integration and at the same time the dynamic range of an output signal can be kept stable.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

In order to achieve the objects and in accordance with the purpose of the present invention, as embodied and broadly described herein, there is provided a power amplifier circuit for amplifying an analog signal comprising: a signal input terminal for receiving an analog input signal; a signal output terminal for producing an analog output signal; a first power source for supplying a ground voltage; a second power source; a third power source; first and second resistors series-connected between said first and third power sources so as to obtain a reference voltage signal at a common node between said first and second resistors; a MOS differential amplifier having two input terminals and one output terminal, one of said two input terminals of said MOS differential amplifier receiving a signal corresponding to the analog input signal received at said signal input terminal, and the other of said two input terminals receiving the reference voltage signal; a bipolar transistor driven by a signal from said output terminal of said MOS differential amplifier, so that one end of a collector-emitter path of said bipolar transistor is connected to said first power source and the other end thereof is connected to said signal output terminal; load means one end of which is connected to said signal output terminal and the other end of which is connected to said third power source; and a third resistor inserted between said second power source and a common node between said first and second resistors so as to regulate a DC voltage at said signal output terminal.

The accompanying drawings, which are incorporated in and constitute a part of this specification, illustrate one embodiment of the invention and together with the description, serve to explain the principles of the invention.

BRIEF DESCRIPITON OF THE DRAWINGS

FIG. 1 is a circuit diagram of an analog signal power amplifier circuit constructed according to a first embodiment of the present invention;

FIG. 2 is a circuit diagram of an equivalent circuit of the circuit shown in FIG. 1;

FIG. 3 is a sectional view showing part of an element structure of the circuit shown in FIG. 1;

FIGS. 4A and 4B are respectively circuit diagrams of bias circuits each of which can be used in the circuit shown in FIG. 1;

FIGS. 13 to 25 are circuit diagrams of analog signal power amplifier circuits constructed according to seventh to nineteenth embodiments, respectively, of the present invention.

DETAILED DESCRIPTION OF THE PREFERRED EMBODIMENTS

Figure 5:
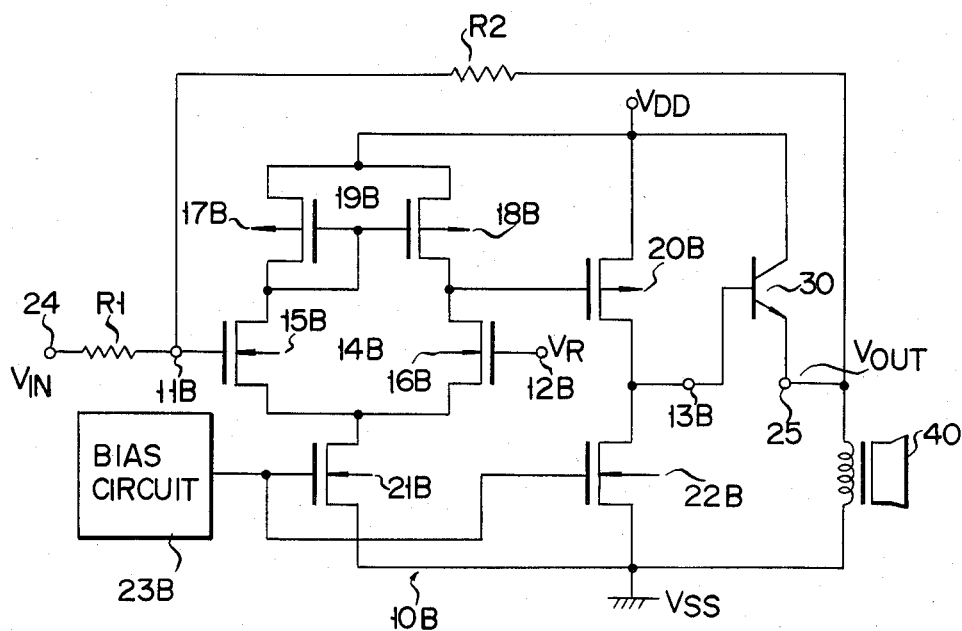
FIG. 5 is a circuit diagram of an analog signal power amplifier circuit constructed according to a second embodiment of the present invention.

FIG. 1 is a circuit diagram of an analog signal power amplifier circuit according to a first embodiment of the present invention. The analog signal power amplifier circuit has a MOS differential amplifier 10 with two input terminals 11 and 12 and an output terminal 13, an output npn transistor 30, two resistors R1 and R2 and a loudspeaker 40 as a load circuit.

The MOS differential amplifier 10 comprises a differential amplification pair 14, a load circuit 19, an n-channel MOS (buffer amplifier) transistor 20, a p-channel MOS (current source) transistor 21, a p-channel MOS (current source) transistor 22, and a bias circuit 23. The differential amplification pair 14 has p-channel MOS transistors 15 and 16. The gates of the p-channel MOS transistors 15 and 16 serve as the input terminals 11 and 12, respectively. The load circuit 19 is constituted by a current mirror circuit of two n-channel MOS transistors 17 and 18. These transistors 17 and 18 are inserted between the differential amplification pair 14 and a reference power source $V_{SS}$ for supplying a ground voltage.

The n-channel MOS transistor 20 amplifies a signal voltage at the common node between the MOS transistors 16 and 18. One end of the MOS transistor 20 is connected to the power source $V_{SS}$. The MOS transistor 21 is inserted between the differential amplification pair 14 and a power source $V_{DD}$ (positive) so as to supply an operating current to the differential amplification pair 14. The MOS transistor 22 is inserted between the current path of the MOS transistor 20 and the power source $V_{DD}$ to supply an operating current to the MOS transistor 20. The MOS transistor 22 also serves as a load of the MOS transistor 20. The bias circuit 23 applies a predetermined bias voltage lower than the power source voltage $V_{DD}$ to the gates of the MOS transistors 21 and 22 which are then operated. The output terminal 13 of the MOS differential amplifier 10 corresponds to the common node between the MOS transistors 20 and 22.

According to the analog signal power amplifier circuit of this embodiment, an analog input signal $V_{IN}$ is supplied to a signal input terminal 24, and an analog output signal $V_{OUT}$ appears at a signal output terminal 25. A resistor R1 is inserted between the signal input terminal 24 and the input terminal 11 of the MOS differential amplifier 10. A resistor R2 is inserted between the signal output terminal 25 and the input terminal 11. A reference voltage signal $V_R$ which is substantially equal to a DC bias voltage of the analog input signal $V_{IN}$ supplied to the signal input terminal 24 is applied from a reference voltage source means (not shown) to the input terminal 12 of the MOS differential amplifier 10. It should be noted that the reference voltage source means comprises, e.g., a voltage divider for dividing the reference power source voltage $V_{DD}$.

The base of an npn transistor 30 is connected to the output terminal 13 of the MOS differential amplifier 10. The collector of the npn transistor 30 is connected to the power source $V_{DD}$, and the emitter thereof is connected to the signal output terminal 25. The collector-emitter path of the npn transistor 30 is thus inserted between the power source $V_{DD}$ and the signal output terminal 25. The loudspeaker 40 is inserted between the signal output terminal 25 and the power source $V_{SS}$.

In the analog signal power amplifier circuit having the arrangement described above, since a low-impedance load circuit (i.e., the loudspeaker 40) is driven wherein the impedance of the loudspeaker 40 with respect to the speech signal falls within a range between several ohms and several tens of ohms, the bipolar npn transistor 30 is arranged instead of a MOS transistor at the output stage since the bipolar transistor can provide a large output current while being small in size. Furthermore, in order to properly drive the npn transistor 30, a base current of several tens of microamperes to several milliamperes is required. Therefore, the MOS differential amplifier 10 is used as a preamplifier means for the analog input signal $V_{IN}$.

The operation of the analog signal power amplifier circuit of this embodiment will be described hereinafter. Now assume that the analog input signal $V_{IN}$ is set at the positive polarity and is then increased. The MOS transistor 15 as one of the differential amplification pair 14 comes into an almost cut-off state, so that a current flowing therethrough is decreased. Conversely, a current flowing through the MOS transistor 16 as the other of the differential amplification pair 14 is increased. Therefore, the gate voltage of the MOS transistor 20 is increased, so that the MOS transistor 20 comes into a more stable ON state and a voltage at the output terminal 13 decreases. Along with this voltage drop, the base-emitter current of the npn transistor 30 decreases. The npn transistor 30 comes into an almost cut-off state, so that the voltage of the analog output signal $V_{OUT}$ at the signal output terminal 25 is decreased. As a result, when the voltage of the analog input signal $V_{IN}$ is increased, the voltage of the analog output signal $V_{OUT}$ decreases. Since the signal output terminal 25 is connected to the input terminal 11 (which receives the analog input signal $V_{IN}$) of the MOS differential amplifier 10 through the resistor R2, the voltage of the analog output signal $V_{OUT}$ decreases until it reaches the reference voltage signal $V_R$.

However, when the voltage of the analog input signal $V_{IN}$ is decreased, the MOS transistor 15 comes into a more stable ON state, so that a current flowing therethrough is increased. On the other hand, the current flowing through the MOS transistor 16 is decreased, and the MOS transistor 20 comes close to the OFF state. As a result, the voltage at the output terminal 13 is increased. Along with this, the base-emitter current flowing through the npn transistor 30 is increased. The npn transistor 30 comes close to the fully ON state. As a result, the voltage of the output signal $V_{OUT}$ increases. In other words, when the voltage of the analog input signal $V_{IN}$ is decreased, the voltage of the analog output signal $V_{OUT}$ increases. In this case, the voltage of the analog output signal $V_{OUT}$ increases until it reaches the voltage of the reference voltage signal $V_R$.

In the circuit of this embodiment, the output signal $V_{OUT}$ having a phase opposite to that of the analog input signal $V_{IN}$ appears at the signal output terminal 25. The value of the signal $V_{OUT}$ is determined by the resistors R1 and R2 with respect to the value of the analog input signal $V_{IN}$: the value is obtained by multiplying the analog input signal $V_{IN}$ by a gain of R2/R1. Therefore, the resistances of the resistors R1 and R2 can be properly set to obtain a sufficiently high $V_{OUT}$. Furthermore, the loudspeaker 40 is driven by the bipolar npn transistor 30. A large current can flow through the npn transistor 30, so that the loudspeaker 40 is driven by sufficiently high power.

The differential amplifier 10 is used as a preamplifier for the npn transistor 30. The reference voltage signal $V_R$ is supplied to one of the input terminals of the differential amplifier 10. For this reason, the operating point of the MOS differential amplifier 10 is kept stable. Therefore, the dynamic range of the analog output signal $V_{OUT}$ is also kept stable.

FIG. 2 is a circuit diagram of an equivalent circuit of the analog signal power amplifier circuit shown in FIG. 1. The MOS differential amplifier 10 includes the differential amplification pair 14, the load circuit 19, the MOS buffer amplifier transistor 20, the MOS current source transistors 21 and 22, and the bias circuit 23. The input terminal 11 of the MOS differential amplifier 10 is used as an inverting input terminal, and the input terminal 12 thereof is used as a noninverting input terminal. The MOS differential amplifier 10 is operated by a voltage in a range between the power source voltages $V_{DD}$ and $V_{SS}$.

FIG. 3 is a sectional view showing the structure of the MOS transistors 20 and 22 and the npn transistor 30 of the analog signal power amplifier circuit shown in FIG. 1. P-well regions 52 and 53 are formed in surface regions of an n-type silicon semiconductor substrate 51. N+-type semiconductor regions 54 and 55 for the source and drain regions of the n-channel MOS transistor 20 are formed in a surface region of the p-well region 52 to be separated from each other. A gate insulating layer 56 is deposited on a surface portion of the n-type silicon substrate 51 so as to extend over the n+-type semiconductor regions 54 and 55. A gate electrode 57 is formed on the gate insulating layer 56.

P+-type semiconductor regions 58 and 59 which respectively serve as the source and drain regions of the p-channel MOS transistor 22 are formed in a surface region of the n-type silicon substrate 51 to be separated from each other. A gate insulating layer 60 is formed to extend over the p+-type semiconductor regions 58 and 59. A gate electrode 61 is then formed on the gate insulating layer 60. An n+-type semiconductor region 62 and a p+-type semiconductor region 63 are formed in a surface region of the p-well region 53 to be separated from each other. Furthermore, an n+-type semiconductor region 64 is formed in a surface region of the n-type silicon substrate 51 in the vicinity of the p-well region 53. The npn transistor 30 has as its base the p-well region 53, as its emitter the n+-type semiconductor region 62, as its collector the n-type silicon substrate 51, and as its collector contact the n+-type semiconductor region 64.

As described above, the p- and n-channel MOS transistors can be formed together with a bipolar transistor on a single chip. As previously described, a large current can flow through a bipolar transistor of a considerably small size. Therefore, high power can be obtained without increasing the chip size when the circuit shown in FIG. 1 is constituted by an integrated circuit. For example, in order to obtain an output current of 10 mA using a MOS transistor, a channel width must be designed to be about 10,000 μm. In this manner, the chip size is greatly increased. However, in the case of obtaining the same current using a bipolar transistor, only an area of 100 μm$^2$ is required.

FIGS. 4A and 4B show detailed arrangements of bias circuits each of which is used as the bias circuit 23 in the analog signal power amplifier circuit shown in FIG. 1.

In the bias circuit shown in FIG. 4A, a series circuit of a p-channel MOS transistor 71 and an n-channel MOS transistor 72 is inserted between the power source $V_{DD}$ and the power source $V_{SS}$. The gate of the MOS transistor 71 is connected to the common node between the MOS transistors 71 and 72, and the gate of the MOS transistor 72 is connected to the power source $V_{DD}$.

A voltage at the common node between the MOS transistors 71 and 72 is lower than the power source voltage $V_{DD}$ by an intrinsic threshold voltage $V_{thI}$ of the MOS transistor 71. The gate voltage of the MOS transistor 71 is set by the voltage (lowered by the threshold voltage $V_{thI}$ from the power source voltage $V_{DD}$) and the ON resistance of the MOS transistor 72 to be at a predetermined voltage lower than the power source voltage $V_{DD}$. The gate voltage of the MOS transistor 71 is supplied as the bias voltage to the gates of the MOS transistors 21 and 22.

In the bias circuit shown in FIG. 4B, a series circuit of a p-channel MOS transistor 73 and two n-channel MOS transistors 74 and 75 is inserted between the power sources $V_{DD}$ and $V_{SS}$. The gate of the MOS transistor 73 is connected to the common node of the MOS transistors 73 and 74. The gate of the MOS transistor 74 is also connected to the common node between the MOS transistors 73 and 74. The gate of the MOS transistor 75 is connected to the common node between the MOS transistors 74 and 75.

In the same manner as in the bias circuit of FIG. 4A, the voltage at the common node between the MOS transistors 73 and 74 of the bias circuit of FIG. 4B is lower than the power source voltage $V_{DD}$ by an intrinsic threshold voltage $V_{thI}$ of the MOS transistor 73. This lowered voltage and the ON resistance of the series arrangement of the MOS transistors 74 and 75 determine the gate voltage of the MOS transistor 73 at a predetermined voltage lower than the power source voltage $V_{DD}$.

FIG. 5 is a circuit diagram of an analog signal power amplifier circuit according to a second embodiment of the present invention. MOS transistors of a differential amplifier 10B used in this circuit have a channel type opposite to those of the MOS transistors in the circuit shown in FIG. 1. The same reference numerals as used in FIG. 1 denote the same parts in FIG. 5 with a suffix B.

The channels of the MOS transistors in the MOS differential amplifier 10B are inverted from those of the MOS transistors in the MOS differential amplifier 10. The circuit operation of the circuit shown in FIG. 5 is substantially the same as that of the circuit shown in FIG. 1. It should be noted that a bias circuit 23B generates a predetermined bias voltage slightly higher than the power source voltage $V_{SS}$ since n-channel MOS power source transistors 21B and 22B are used in place of the p-channel MOS current source transistors 21 and 22.

Figure 6A:
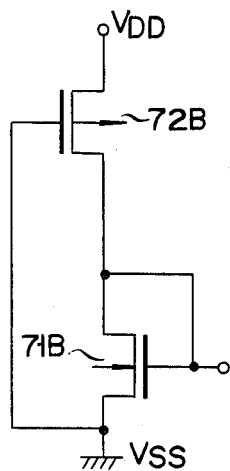
FIGS. 6A and 6B are respectively circuit diagrams of bias circuits each of which can be used in the circuit shown in FIG. 5.
Figure 6B:
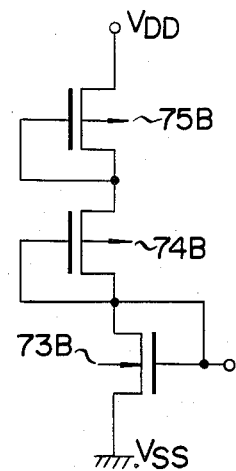

FIGS. 6A and 6B are circuit diagrams of bias circuits each of which is used as a bias circuit 23B in the circuit shown in FIG. 5. The same reference numerals as used in FIGS. 4A and 4B denote the same parts in FIGS. 6A and 6B with a suffix B.

Figure 7:
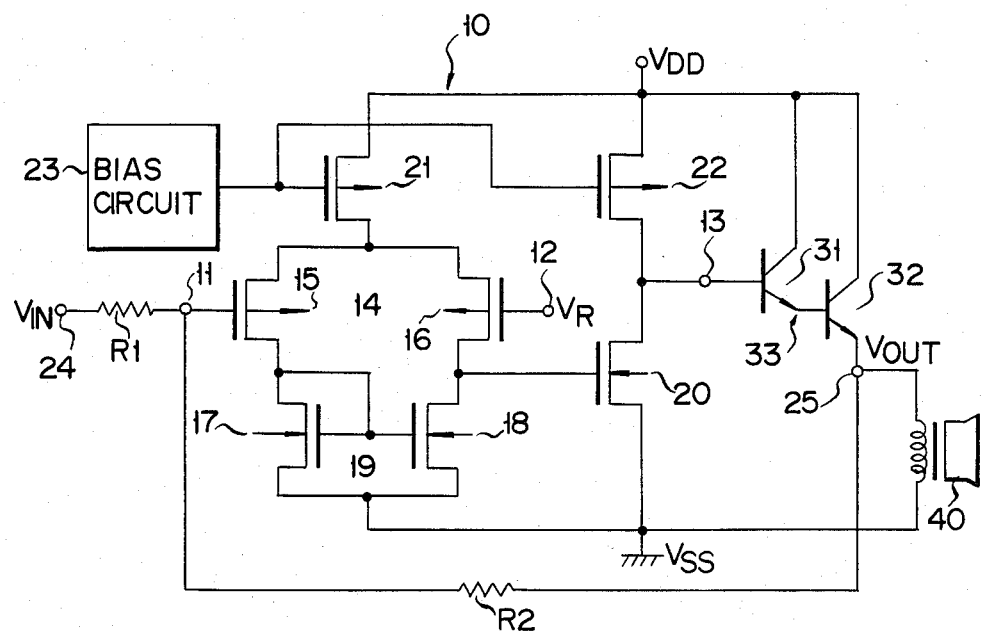
FIGS. 7 and 8 are circuit diagrams of analog signal power amplifier circuits constructed according to third and fourth embodiments of the present invention, respectively.

FIG. 7 is a circuit diagram of an analog signal power amplifier circuit according to a third embodiment of the present invention. A Darlington npn transistor 33 comprised of npn transistors 31 and 32 is used in place of the single npn transistor 30 of the analog signal power amplifier circuit (FIG. 1) so as to amplify the output current which then appears at the signal output terminal 25.

Figure 8:
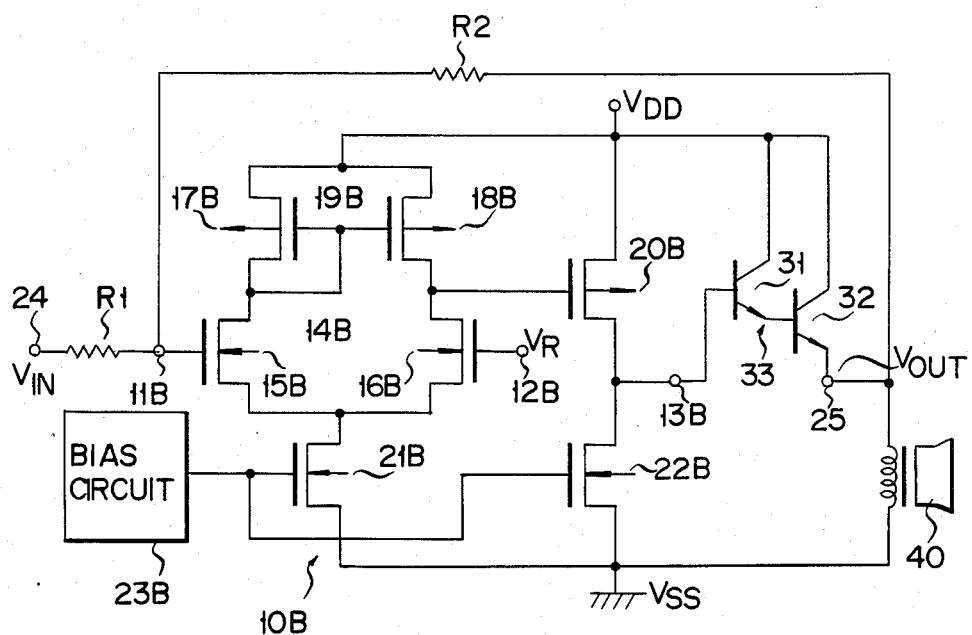

FIG. 8 is a circuit diagram of an analog signal power amplifier circuit according to a fourth embodiment of the present invention. In the same manner as in the circuit of the third embodiment, a Darlington npn transistor 33 comprised of npn transistors 31 and 32 is used in place of the single npn transistor 30 of the analog signal power amplifier circuit (FIG. 7) so as to amplify the output current which then appears at the signal output terminal 25.

Figure 9:
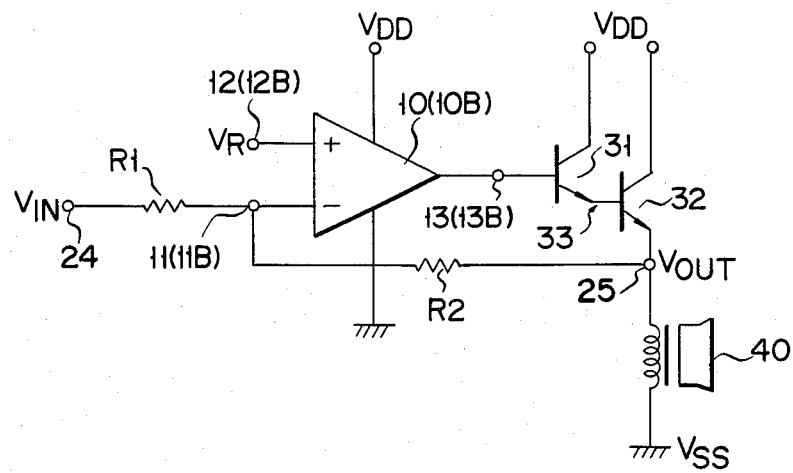
FIG. 9 is a circuit diagram of an equivalent circuit of the circuits shown in FIGS. 7 and 8.

FIG. 9 is a circuit diagram of an equivalent circuit of the circuits shown in FIGS. 7 and 8. In this equivalent circuit, the Darlington npn transistor 33 comprised of the npn transistors 31 and 32 replaces the npn transistor 30 in the circuit shown in FIG. 2.

Figure 10:
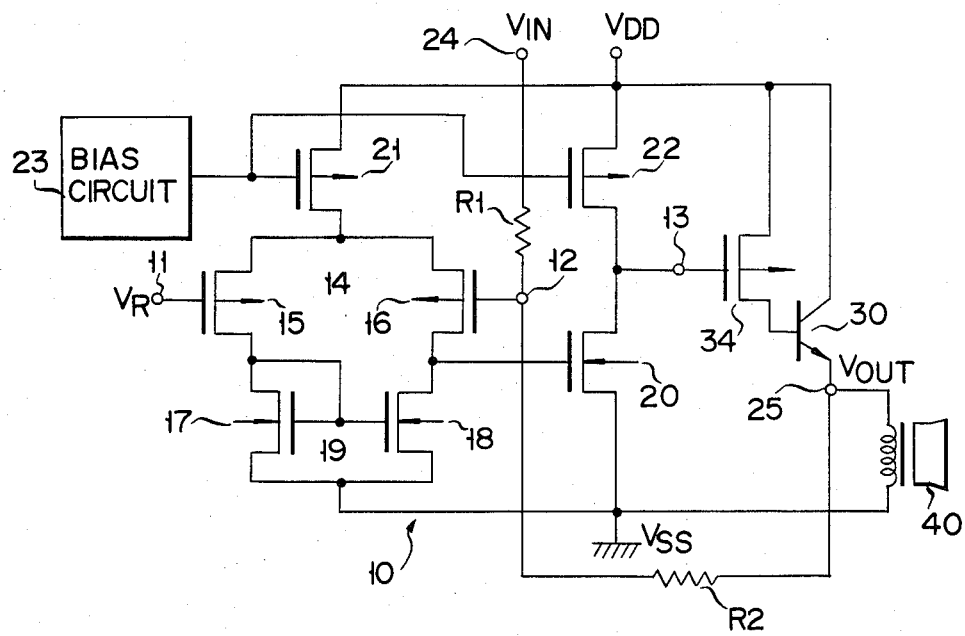
FIGS. 10 and 11 are circuit diagrams of analog signal power amplifier circuits constructed according to fifth and sixth embodiments of the present invention, respectively.

FIG. 10 is a circuit diagram of an analog signal power amplifier circuit according to a fifth embodiment of the present invention. A p-channel current amplifier transistor 34 is arranged between the base of the npn transistor 30 of the analog signal power amplifier circuit (FIG. 1) and the output terminal 13 of the MOS differential amplifier 10 (FIG. 1). A p-channel MOS (current amplifier) transistor 34 is inserted between the power source $V_{DD}$ and the base of the MOS transistor 30. The gate of the MOS transistor 34 is connected to the output terminal 13 of the MOS differential amplifier 10.

Figure 11:
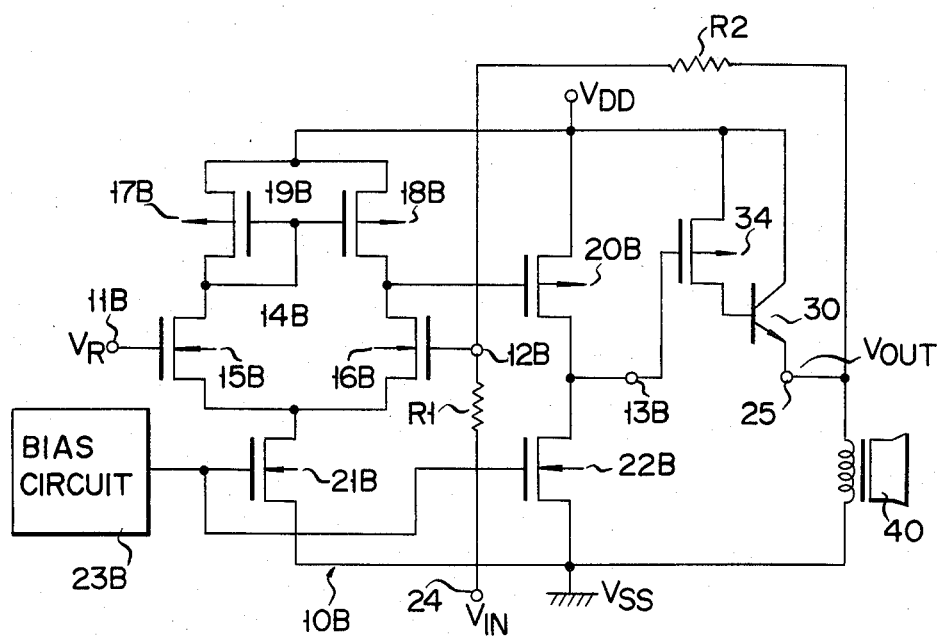

FIG. 11 is a circuit diagram of an analog signal power amplifier circuit according to a sixth embodiment of the present invention. In the same manner as in the analog signal power amplifier circuit shown in FIG. 10, a p- channel MOS (current amplifier) transistor 34 is added in the circuit shown in FIG. 5.

In the analog signal power amplifier circuits shown in FIGS. 10 and 11, the signals at the output terminal 13 of the MOS amplifier circuit 10 and the output terminal 13B of the MOS differential amplifier 10B are inverted by the p-channel MOS transistors 34, respectively. The inverted signals are then supplied to the bases of the npn transistors 30, respectively. The resistors R1 are respectively inserted between the input terminal 12 of the differential amplifier 10 and the corresponding signal input terminal 24 and between the input terminal 12B of the differential amplifier 10B and the corresponding signal input terminal 24. Similarly, the resistors R2 are respectively inserted between the input terminal 12 and the corresponding output terminal 25 and between the input terminal 12B and the corresponding output terminal 25.

Figure 12:
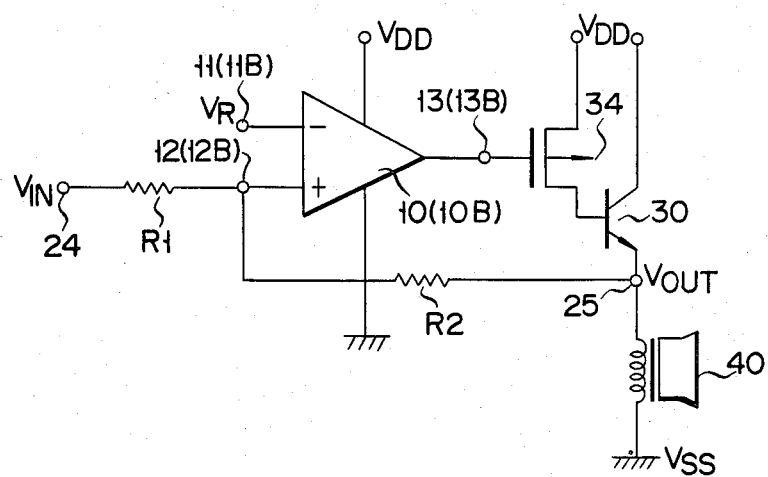
FIG. 12 is a circuit diagram of an equivalent circuit of the circuits shown in FIGS. 10 and 11.

FIG. 12 is a circuit diagram of an equivalent circuit of the analog signal power amplifier circuits shown in FIGS. 10 and 11. In this equivalent circuit, the p-channel MOS current amplifier transistor 34 is added to the arrangement of the circuit shown in FIG. 2. The connections of the two input terminals of the MOS differential amplifier 10 or 10B are reversed to those in FIG. 2. More particularly, the reference voltage signal $V_R$ is applied to the input terminal 11 or 11B, and one end of each of the resistors R1 and R2 is connected to the input terminal 12 or 12B.

In the analog signal power amplifier circuit shown in FIG. 1, a current flows in the MOS differential amplifier 10 and the npn transistor 30 even if the analog input signal $V_{IN}$ is not supplied to the signal input terminal 24, which is thus kept open. For this reason, the circuit shown in FIG. 1 has high power consumption.

FIG. 13 is a circuit diagram of an analog signal power amplifier circuit according to a seventh embodiment of the present invention. A power saving function which is operated in the "power down" state is added to a circuit arrangement wherein the analog signal power amplifier circuit has the bias circuit shown in FIG. 4B. Referring to FIG. 13, a current path of a p-channel MOS transistor 76 is formed between the power source $V_{DD}$ and the common node between the MOS transistors 74 and 75 of the bias circuit 23. A current path of an n-channel MOS transistor 77 is formed between the power source $V_{SS}$ and the gate of the MOS transistor 20 of the MOS differential amplifier 10. Furthermore, a current path of an n-channel MOS transistor 78 is formed between the power source $V_{SS}$ and the base of the npn transistor 30. In addition to these, a signal input terminal 79 is arranged to receive a power down control signal $\overline{PD}$, and a CMOS inverter 82 for inverting the signal $\overline{PD}$ having a p-channel MOS transistor 80 and an n-channel MOS transistor 81 is arranged in the circuit in FIG. 13.

The gates of the MOS transistors 80, 81 and 76 are commonly connected to the signal input terminal 79. The gate of the MOS transistor 75 in the bias circuit 23 is also connected to the signal input terminal 79 in place of the common node between the MOS transistors 74 and 75. The common node between the MOS transistors 80 and 81 serves as the output terminal of the CMOS inverter 82 and is connected to the gates of the MOS transistors 77 and 78.

In the analog signal power amplifier circuit in FIG. 13, when the power down control signal $\overline{PD}$ is rendered nonactive (i.e., $V_{DD}$ level), the MOS transistor 76 is cut off, and the MOS transistor 75 is turned on. This condition holds in the case in which the MOS transistor 76 is not disconnected from the analog signal power amplifier circuit. The bias circuit 23 generates the predetermined bias voltage as previously described. Under this condition, the output signal from the CMOS inverter 82 is set at the $V_{SS}$ level. The MOS transistors 77 and 78 are then cut off. Therefore, when the power down control signal $\overline{PD}$ is nonactive, the MOS differential amplifier 10 and the npn transistor 30 are rendered operative. When the analog input signal $V_{IN}$ is supplied to the signal input terminal 24, it can be amplified.

However, when the power down control signal $\overline{PD}$ is rendered active ($V_{SS}$ level), the MOS transistor 75 is cut off. A potential at the common node between the MOS transistors 74 and 75 in the bias circuit 23 is set by the MOS transistor 76 substantially at the $V_{DD}$ level. The gate voltage of the MOS transistor 73 is then kept substantially at the $V_{DD}$ level. The two MOS transistors 21 and 22 in the MOS differential amplifier 10 are cut off. Substantially no current flows through the MOS transistors 21 and 22. Under this condition, the MOS transistor 75 in the bias circuit 23 is cut off, and substantially no current flows through the bias circuit 23.

When the power-down control signal $\overline{PD}$ is set at the $V_{SS}$ level, the output signal from the CMOS inverter 82 is set at the $V_{DD}$ level, and the MOS transistors 77 and 78 are turned on. When the MOS transistor 77 is turned on, the MOS transistor 20 is cut off. On the other hand, when the MOS transistor 78 is turned on, the base of the npn transistor 30 is coupled to the power source $V_{SS}$. Substantially no current flows through the npn transistor 30.

In the analog signal power amplifier circuit in FIG. 13, when the power-down control signal $\overline{PD}$ is rendered active, a steady current does not flow between the power sources $V_{DD}$ and $V_{SS}$. As a result, power consumption can be decreased to a small amount caused by only the leakage current.

Figure 14:
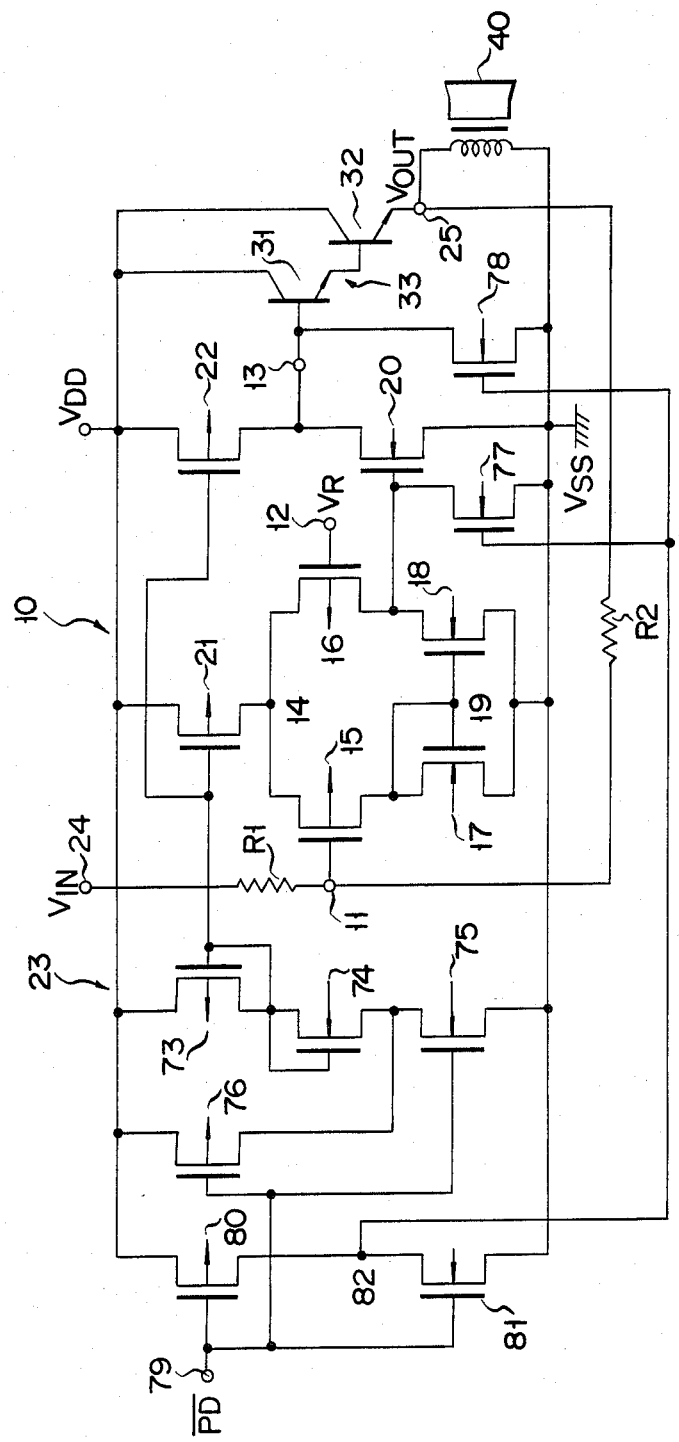

FIG. 14 is a circuit diagram of an analog signal power amplifier circuit according to an eighth embodiment of the present invention. In this circuit, a Darlington npn transistor 33 having two npn transistors 31 and 32 is used in place of the single npn transistor 30 (FIG. 13) so as to amplify the output current appearing at the signal output terminal 25 in the same manner as in the equivalent circuit in FIG. 9. In this case, the current path of the MOS transistor 78 is inserted between the base of the npn transistor 31 (immediately preceding transistor) and the power source $V_{SS}$.

Figure 15:
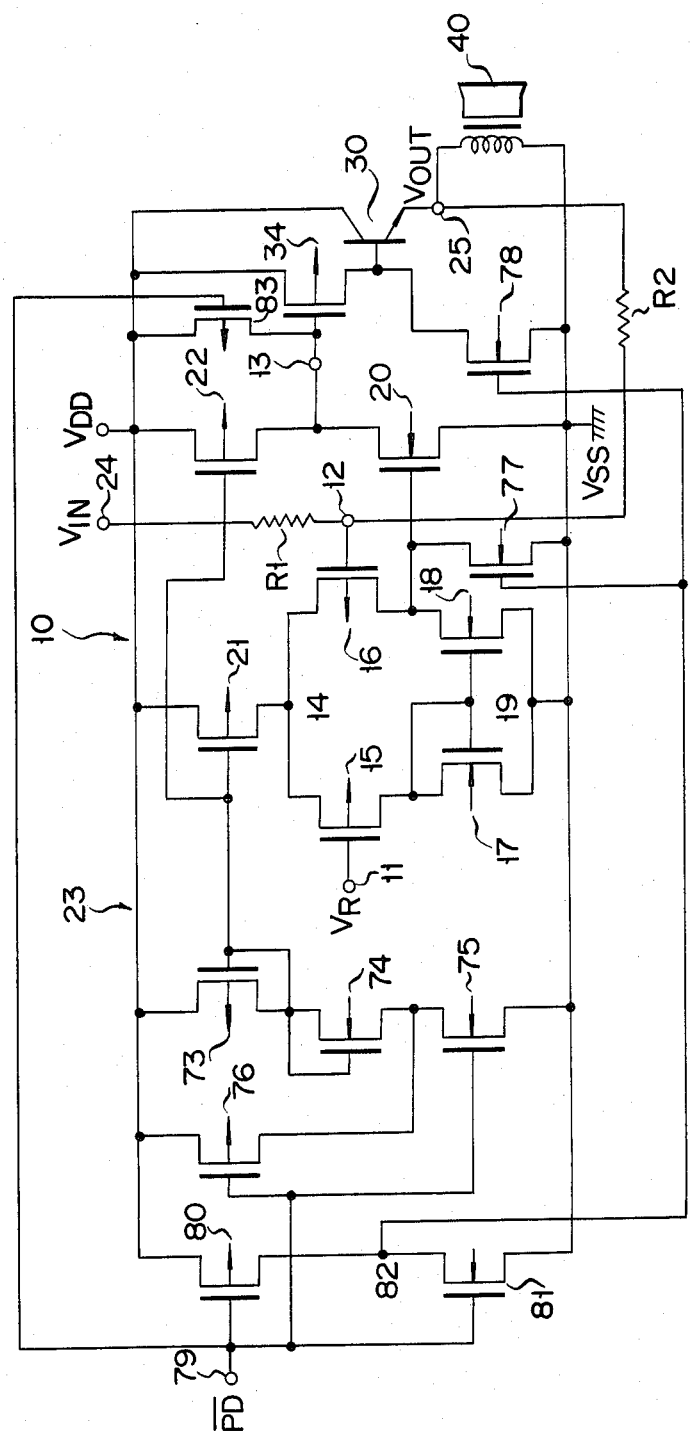

FIG. 15 is a circuit diagram of an analog signal power amplifier circuit according to a ninth embodiment of the present invention. A p-channel MOS transistor 34 is inserted between the base of the npn transistor 30 (FIG. 13) and the output terminal 13 of the MOS differential amplifier 10 (FIG. 13) so as to amplify the output current signal appearing at the signal output terminal 25 in the same manner as in the equivalent circuit of FIG. 12. In order to obtain the output signal $V_{OUT}$ (which has a phase opposite to that of the analog input signal $V_{IN}$) at the signal output terminal 25, a resistor R1 is inserted between a signal input terminal 24 and an input terminal 12 of the MOS differential amplifier 10, and a resistor R2 is inserted between the input terminal 12 and the signal output terminal 25. The reference voltage signal $V_R$ is supplied to another input terminal 11 of the MOS differential amplifier 10. With the circuit arrangement embodying this invention, the current path of a P-channel MOS transistor 83 is inserted between the gate of the MOS transistor 34 and power source $V_{DD}$. This arrangement is intended to cut off both MOS transistor 34 and npn transistor 30 when a power-down control signal $\overline{PD}$ is rendered active. Further, the current path of the N-channel MOS transistor 78 is inserted between the base of the npn transistor 30 and the power source $V_{SS}$. The gate of said MOS transistor 83 is connected to the signal input terminal 79.

Figure 16:
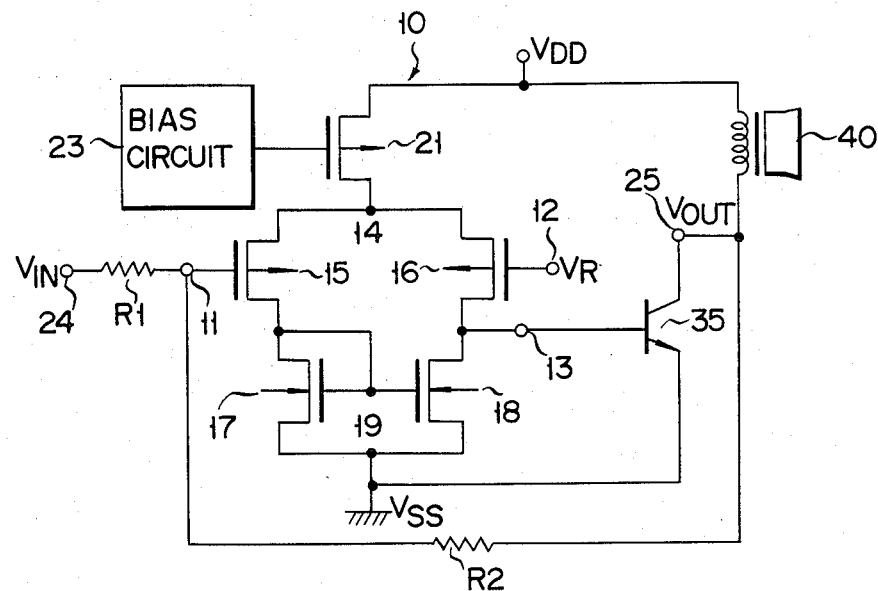

FIG. 16 is a circuit of an analog signal power amplifier circuit according to a tenth embodiment of the present invention. This circuit is obtained by omitting the n-channel MOS (buffer amplifier) transistor 20 and the MOS (power source) transistor 22 from the MOS differential amplifier 10 (FIG. 1) and by forming an output terminal 13 at the common node between the MOS transistors 16 and 18. In order to produce at a signal output terminal an analog output signal $V_{OUT}$ having a phase opposite to that of an analog input signal $V_{IN}$, the base of an npn transistor 35 is connected to the output terminal 13 of the MOS differential amplifier 10, the collector thereof is connected to the signal output terminal 25, and the emitter thereof is connected to the power source $V_{SS}$. A loudspeaker 40 is inserted between the signal output terminal 25 and the power source $V_{DD}$.

In the analog signal power amplifier circuit in FIG. 16, when the analog input signal $V_{IN}$ has positive polarity and the voltage thereof is increased, the MOS transistor 15 comes into almost cut-off state and the voltage at the output terminal 13 is increased in the same manner as in the circuit shown in FIG. 1. Subsequently, the npn transistor 35 comes close to the ON state, so that the level of the analog output signal $V_{OUT}$ is lowered. However, when the level of the analog input signal $V_{IN}$ is lowered, the level of the signal $V_{OUT}$ is raised. When the voltage at the input terminal 11 becomes equal to the reference voltage $V_R$, a change in voltage at the signal output terminal 25 is interrupted. In this circuit in the same manner as the above embodiments, the output signal $V_{OUT}$ having the phase opposite to the analog input signal $V_{IN}$ can be obtained. The value of the output singal $V_{OUT}$ corresponds to the voltage obtained by multiplying the analog input singal $V_{IN}$ by a gain determined in accordance with the ratio R2/R1.

In the analog signal power amplifier circuits of the preceding embodiments, the differential amplifier 10 or 10B and the bipolar transistor (i.e., npn transistor 30) for directly driving the loudspeaker 40 are driven by the single power source $V_{DD}$. However, in the following embodiments, the analog signal power amplifier is used in an integrated circuit for compact electronic equipment such as an electronic compact calculator and an electronic watch. A small dry cell is used as a power supply means in the compact electronic equipment. The output voltage of the small dry cell is generally low. When this output voltage is applied to operate the integrated circuit including the analog signal power amplifier circuit, the output voltage at the MOS differential amplifier 10 of the analog signal power amplifier becomes as low as the output voltage from the dry cell. As a result, a sufficiently high power cannot be obtained.

FIGS. 17 to 25 are circuit diagrams of analog signal power amplifier circuits according to eleventh to nineteenth embodiments of the present invention. In these analog signal power amplifier circuits, a power source voltage which is applied to the MOS differential amplifier as the preamplifier stage of the analog input signal $V_{IN}$ is increased to properly drive the bipolar transistor for driving the loudspeaker, thereby supplying a sufficiently high power to the loudspeaker.

The analog signal power amplifier circuits of these embodiments will be described in detail hereinafter. It should be noted that a reference power source $V_{SS}$ (0 V), a negative power source $V_{DD1}$ (e.g., −3 V) and another negative power source $V_{DD2}$ (e.g., −1.5 V) are used.

Figure 17:
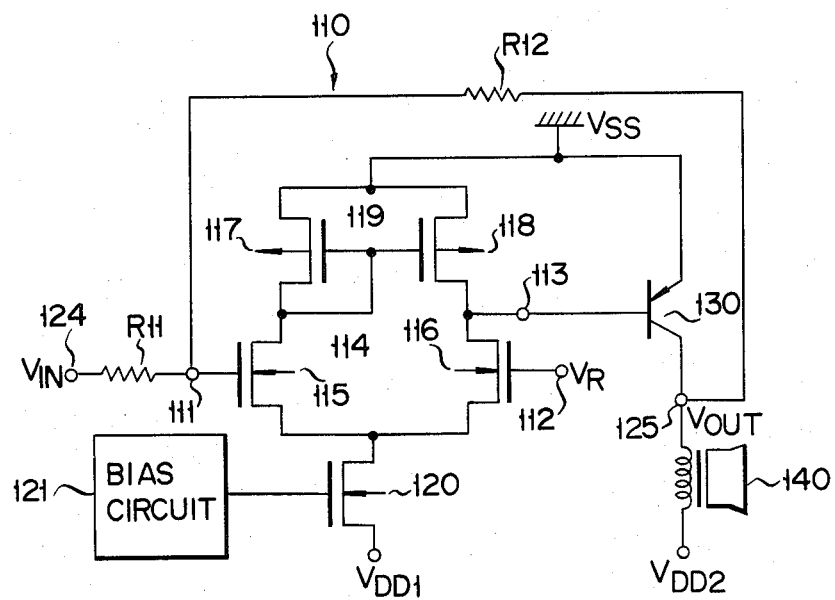

The analog signal power amplifier circuit shown in FIG. 17 has a MOS differential amplifier 110 with two input terminals 111 and 112 and an output terminal 113, a pnp transistor 130 as an output stage, and a loudspeaker 140 as a load circuit.

The MOS differential amplifier 110 further comprises a differential amplification pair 114, a load circuit 119, an n-channel MOS current source transistor 120, and a bias circuit 121. The differential amplification pair 114 has two n-channel MOS transistors 115 and 116 which have gates respectively serving as the input terminals 111 and 112. The load circuit 119 comprises a current mirror circuit which has two p-channel MOS transistors 117 and 118 and which is inserted between the differential amplification pair 114 and the reference power source $V_{SS}$. The n-channel current source transistor 120 is inserted between the differential amplification pair 114 and the power source $V_{DD1}$. A predetermined bias voltage slightly higher than the power source voltage $V_{DD1}$ toward the reference power source voltage $V_{SS}$ is applied by the bias circuit 121 to the gate of the n-channel MOS current source transistor 120 which is then operated. The output terminal 113 of the MOS differential amplifier 110 is coupled to the common node of the MOS transistors 116 and 118.

In the analog signal power amplifier circuit in FIG. 17, the analog input signal $V_{IN}$ is supplied to a signal input terminal 124, and the analog output signal $V_{OUT}$ appears at a signal output terminal 125. A resistor R11 is inserted between the input terminal 111 of the MOS differential amplifier 110 and the signal input terminal 124. A resistor R12 is inserted between the input terminal 111 of the MOS differential amplifier 110 and the signal output terminal 125. A reference voltage signal $V_R$ which has the same level as the DC bias voltage of the analog input signal $V_{IN}$ is applied by a power supply means (not shown) to the input terminal 112 of the MOS differential amplifier 110. It should be noted that the power supply means comprises a voltage divider for dividing the potential between the power source voltages $V_{DD1}$ and $V_{SS}$.

The base of the pnp transistor 130 is coupled to the output terminal 113 of the MOS differential amplifier 110. The emitter of the pnp transistor 130 is connected to the power source $V_{SS}$, and the collector thereof is connected to the signal output terminal 125. The collector-emitter path of the pnp transistor 130 is inserted between the power source $V_{SS}$ and the signal output terminal 125. The loudspeaker 140 is inserted between the signal output terminal 125 and the power source $V_{DD2}$.

The bias circuit 121 is arranged such that the power source $V_{DD}$ of the bias circuit shown in FIG. 6A or 6B is replaced with the power source $V_{SS}$ and the power source $V_{SS}$ thereof is replaced with the power source $V_{DD1}$.

In the analog signal power amplifier circuit in FIG. 17, the power source voltage $V_{DD1}$ having an absolute value twice that of the power source voltage $V_{DD2}$ is used to drive the MOS differential amplifier 110, thereby providing sufficiently high power at the output terminal 113. Therefore, the pnp transistor 130 can be properly driven, so that the sufficiently high power is obtained at the loudspeaker 140. In this embodiment, since the power source voltages $V_{DD1}$ and $V_{DD2}$ are both negative, the DC bias voltage of the analog input signal $V_{IN}$ must also be negative.

Furthermore, in the above circuit, the power source voltage $V_{DD1}$ is used to drive only the MOS differential amplifier 110. In this sense, a very large current is not required, so that the power source voltage $V_{DD2}$ may only be doubled or boosted to obtain $2 \cdot V_{DD2}$ as the power source voltage $V_{DD1}$.

Figure 18:
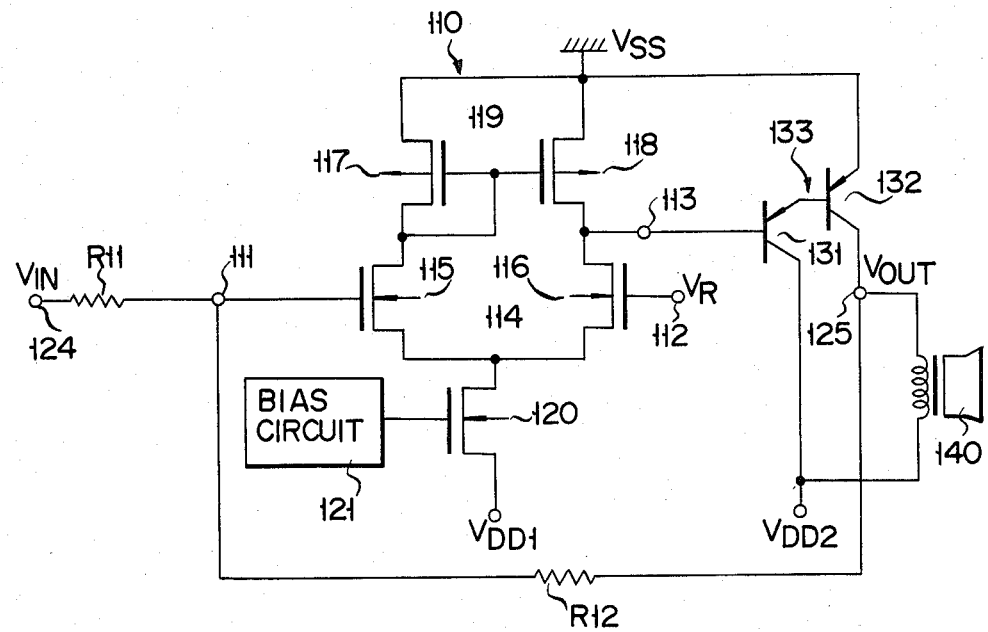

In an analog signal power amplifier circuit in FIG. 18, a Darlington pnp transistor 133 having a pnp transistor 131 (first stage) and a pnp transistor 132 (second stage) replace the single pnp transistor 130 (FIG. 17) so as to amplify the current which then appears at the signal output terminal 125. More particularly, the base of the pnp transistor 131 is connected to the output terminal 113 of the MOS differential amplifier 110, the collector thereof is connected to the power source $V_{DD2}$, and the emitter thereof is connected to the base of the pnp transistor 132. The emitter of the pnp transistor 132 is connected to the power source $V_{SS}$, and the collector thereof is connected to the signal output terminal 125. Therefore, the collector-emitter path of the Darlington pnp transistor 133 is formed between the power source $V_{SS}$ and the signal output terminal 125.

Figure 19:
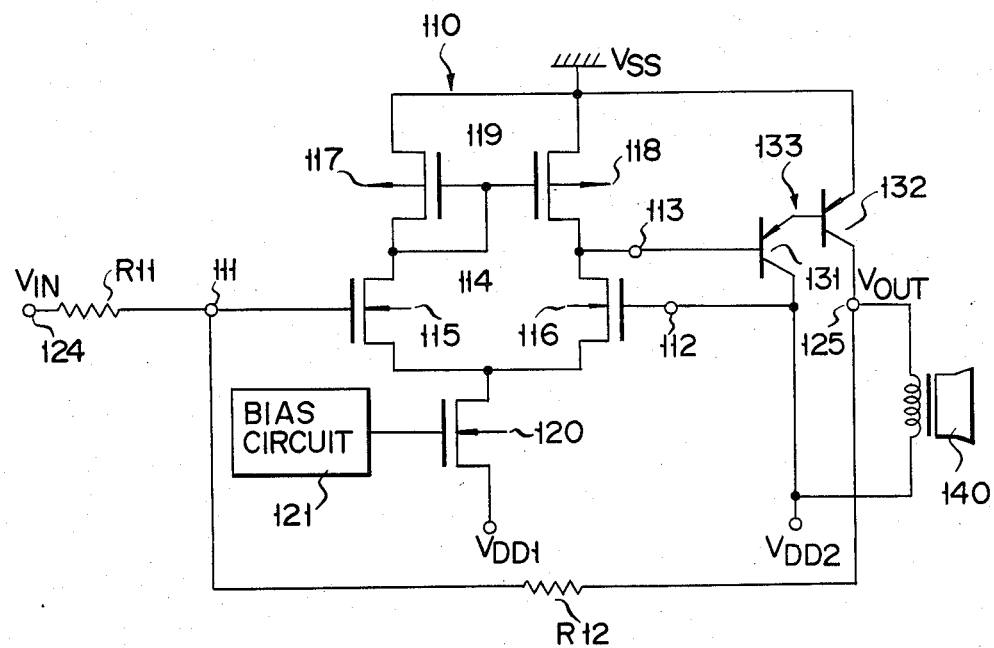

In an analog signal power amplifier circuit shown in FIG. 19, a Darlington pnp transistor 133 is arranged in the same manner as in the circuit shown in FIG. 18. At the same time, an input terminal 112 of a MOS differential amplifier 110 is connected to a power source $V_{DD2}$. In this case, the power source voltage $V_{DD2}$ is applied as the reference voltage signal $V_R$. It should be noted that the absolute value of the power source voltage $V_{DD1}$ is twice that of the power source voltage $V_{DD2}$.

Figure 20:
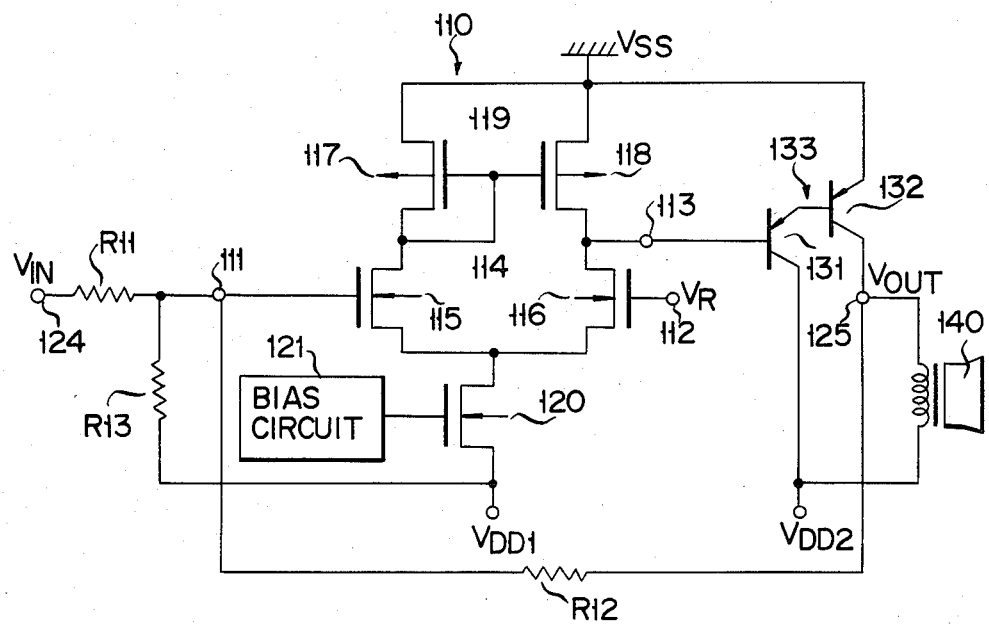

In the circuits of the embodiments shown in FIGS. 17 to 19, the MOS differential amplifier 110 and the pnp transistor 130 or the Darlington pnp transistor 133 are powered by different power source voltages $V_{DD1}$ and $V_{DD2}$. For this reason, the DC voltage level at the signal output terminal 125 may deviate from the reference voltage signal $V_R$. In order to eliminate this, resistors are inserted to regulate voltages at the signal output terminals 125 of the analog signal power amplifier circuits in FIGS. 20 and 21, respectively. Referring to FIG. 20, a voltage regulating resistor R13 is inserted between an input terminal 111 of an MOS differential amplifier 110 and a power source $V_{DD1}$. Similarly, in the analog signal power amplifier circuit in FIG. 21, a voltage regulating resistor R14 is inserted between an input terminal 111 of a MOS differential amplifier 110 and a power source $V_{SS}$.

Figure 21:
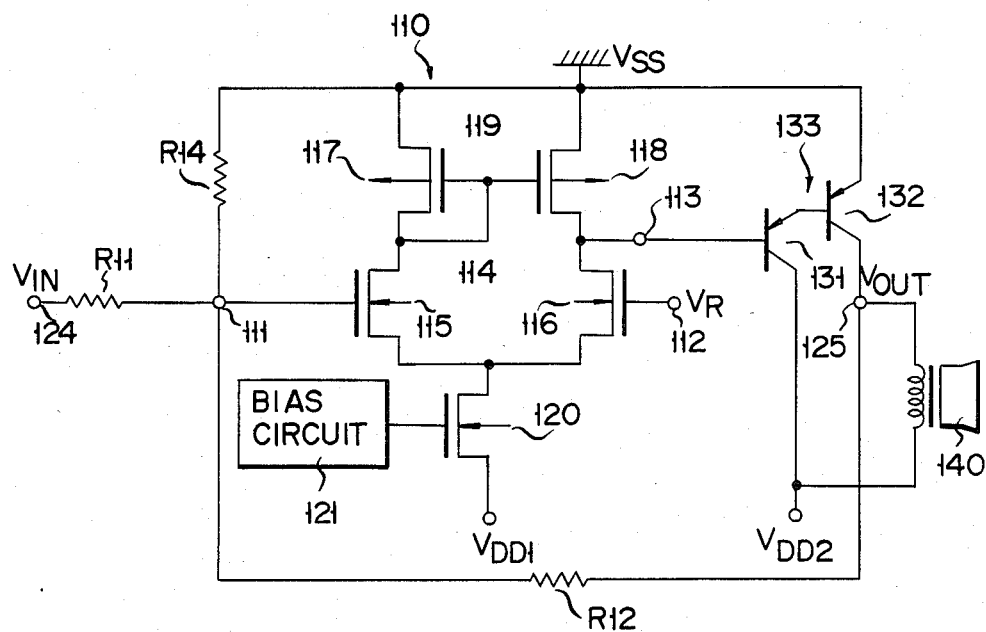

Referring again to FIG. 20, since the resistor R13 is inserted in the manner described above, a DC voltage level of an output signal $V_{OUT}$ at a signal output terminal 125 is shifted from the level of the reference voltage signal $V_R$ to that of the power source voltage $V_{SS}$. On the other hand, as shown in FIG. 21, since the resistor R14 is inserted in the manner described above, a DC voltage level of an output signal $V_{OUT}$ is shifted to the level of the reference voltage signal $V_R$ to that of the power source voltage $V_{DD1}$. If the analog input signal $V_{IN}$ has only the DC bias component (same as $V_R$) without including the signal component, the shift amounts are $(R12/R13)(|V_R| - |V_{DD1}|)$ in the circuit of FIG. 20 and $(R12/R14)(V_{SS} - |V_R|)$ in the circuit of FIG. 21.

Figure 22:
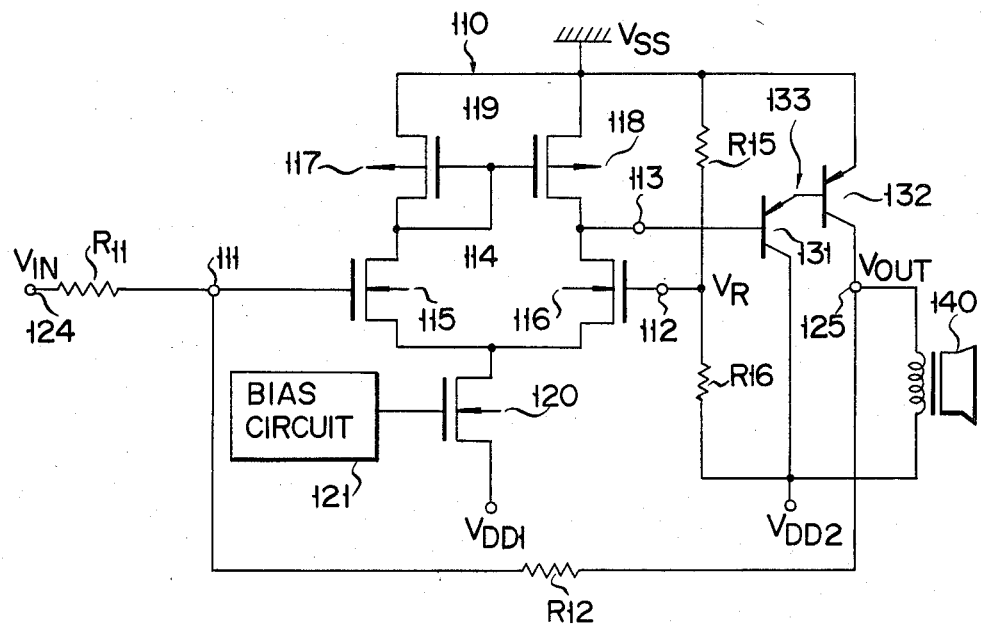

In an analog signal power amplifier circuit according to a sixteenth embodiment shown in FIG. 22, the reference voltage signal $V_R$ supplied to an input terminal 112 of a MOS differential amplifier 110 is obtained by resistors R15 and R16 which are inserted between power sources $V_{SS}$ and $V_{DD2}$. In this embodiment, the reference voltage signal $V_R$ falls within a range between the power source voltages $V_{SS}$ and $V_{DD2}$.

Figure 23:
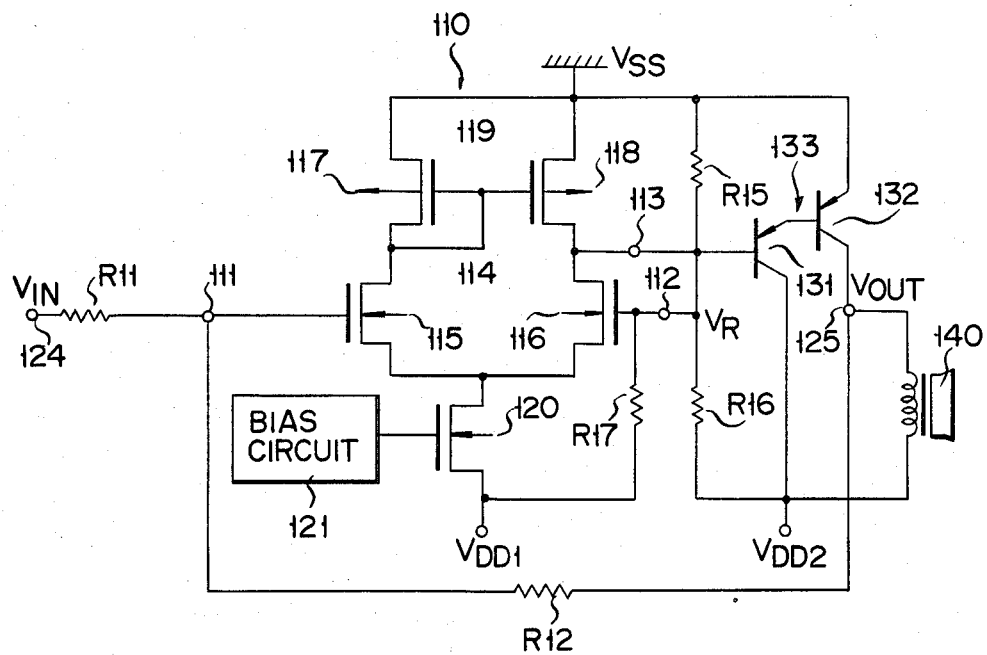
Figure 24:
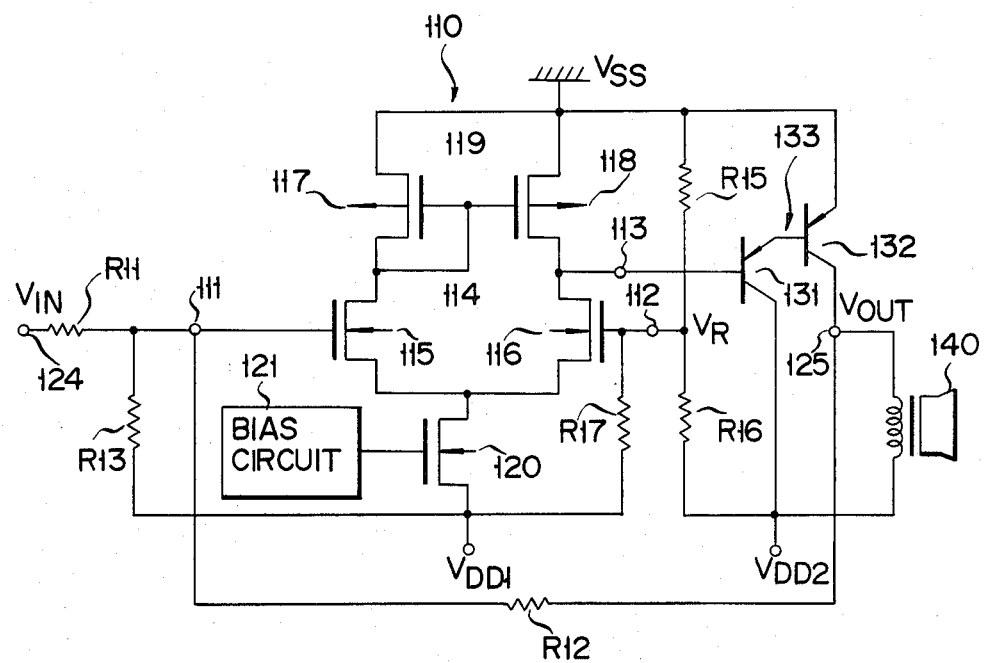

In an analog signal power amplifier circuit according to a seventeenth embodiment shown in FIG. 23, a reference voltage signal $V_R$ applied to one of the input terminals of a MOS differential amplifier 110 is obtained by resistors R15 and R16 which are the same as those in FIG. 22 and by an additional resistor R17 which is inserted between the gate of a MOS transistor 116 and a power source $V_{DD1}$. In this embodiment, the absolute value of the reference voltage signal $V_R$ is given as follows:

$$|V_R| = (R/R17)|V_{DD1}| + (R/R16)|V_{DD2}| \qquad (1)$$

for
$R = (R15 \cdot R16 \cdot R17)/(R15 \cdot R16 + R16 \cdot R17 + R15 \cdot R17)$ In an analog signal power amplifier circuit according to an eighteenth embodiment shown in FIG. 24, a voltage regulating resistor R13 which is the same as that in the circuit of FIG. 20 is added in the circuit of FIG. 18. Furthermore, three resistors R15, R16 and R17 which are the same as those in the circuit of FIG. 23 are added to the the resultant arrangement for providing the reference voltage signal.

According to this embodiment, since the resistor R13 is added, the absolute value of a DC bias voltage $V_{DC}$ at a signal output terminal 125 is given as follows:

$$|V_{DC}| = (R12/R13)(|V_R| - |V_{DD1}|) + |V_R| = -(-R12/R13)|V_{DD1}| + (1 + R12/R13)|V_R| \qquad (2)$$

On the other hand, the absolute value of a reference voltage signal $V_R$ can be given using equation (1) as follows:

$$|V_R| = (R/R17)|V_{DD1}| + (R/R16)|V_{DD2}| \qquad (3)$$

When equation (2) is substituted into equation (3), the following equation is given:

$$|V_{DC}| = (-R12/R13 + R/R17 + R12/R13 \times R/R17)|V_{DD1}| + (R/R16)(1 + R12/R13)|V_{DD2}| \qquad (4)$$

If the resistances of the resistors are set to satisfy the following relations:

$(R/R16)(1 + R12/R13) = \frac{1}{2}$ and $(-R12/R13 + R/R17 + R12/R13 \times R/R17) = 0$, the following relation is given:

$$|V_{DC}| = |V_{DD2}|/2 \qquad (5)$$

In the above embodiment, the DC voltage level at the signal output terminal can fall within a range between the power source voltages $V_{SS}$ and $V_{DD2}$. Therefore, the positive and negative voltage signal amplitudes of the analog output signal $V_{OUT}$ can be set as maximum values without signal distortions.

FIG. 25 is a circuit diagram of an analog signal power amplifier circuit according to a nineteenth embodiment of the present invention. In this embodiment, a power saving function in the power down state is added to the circuit shown in FIG. 24. Furthermore, in the circuit shown in FIG. 25, a bias circuit 121 in a MOS differential amplifier 110 has an n-channel MOS transistor 171 and a p-channel MOS transistor 172 such that a current path thereof is inserted between power sources $V_{DD1}$ and $V_{SS}$. The common node between the MOS transistors 171 and 172 serves as a bias voltage output terminal to which the gate of the MOS transistor 171 is connected.

Furthermore, in the circuit shown in FIG. 25, a current path of an n-channel MOS transistor 180 is formed between the power source $V_{DD1}$ and the common node between the MOS transistors 171 and 172.

In addition to this, a current path of an n-channel transistor 181 is formed between a resistor R13 and the power source $V_{DD1}$. A current path of a p-channel MOS transistor 182 is formed between a resistor R15 and the power source $V_{SS}$. A current path of an n-channel MOS transistor 183 is formed between a resistor R17 and the power source $V_{DD1}$. A current path of a p-channel MOS transistor 184 is formed between the power source $V_{SS}$ and the base of a pnp transistor 131 as the first stage of a Darlington pnp transistor 133. A signal input terminal 179 is arranged in the circuit of this embodiment so as to receive a power-down control signal PD. A CMOS inverter 185 is arrange to invert the power-down control signal PD.

The gates of the MOS transistors 172, 180 and 182 and the input terminal of the CMOS inverter 185 are coupled to the signal input terminal 179. The gates of the MOS transistors 181, 183 and 184 are connected to the output terminal of the CMOS inverter 185.

When the power-down control signal PD is rendered nonactive (i.e., $V_{DD1}$ level) in the circuit shown in FIG. 25, the MOS transistor 172 is turned on, and the MOS transistor 180 is cut off. In this condition, the circuit is equivalent to a circuit which does not have the MOS transistor 180. The bias circuit 121 generates a predetermined bias voltage the level of which is slightly close to the level of the power source voltage $V_{SS}$ from the level of the power source voltage $V_{DD1}$, thereby operating the MOS transistor 120 in a MOS differential amplifier 110. At the same time, the MOS transistor 182 is turned on in response to the powerdown control signal PD, a current can flows through the resistor R15. Under this condition, the output signal from the CMOS inverter 185 is set at the power source voltage $V_{SS}$, thereby turning on the MOS transistors 181 and 183. However, the MOS transistor 184 is cut off. Since the MOS transistors 181 and 183 are turned on, a current can flow through the resistors R13 and R17. Furthermore, since the MOS transistor 184 is cut off, the base of the Darlington pnp transistor 133 is set in the active state so as to amplify the signal from the output terminal 113 of the MOS differential amplifier 110. In this condition, the analog input signal $V_{IN}$ is amplified.

However, when the power down control signal PD is rendered active (i.e., $V_{SS}$ level), the MOS transistor 180 is turned on, so that the bias voltage from the bias circuit 121 is set by the MOS transistor 180 at the power source voltage $V_{DD1}$. As a result, the MOS transistor 120 is cut off, and the MOS differential amplifier 110 does not receive the operating current any longer. The MOS differential amplifier 110 is rendered non-operative. At the same time, there is substantially no current flow through the MOS differential amplifier 110.

Furthermore, the MOS transistors 181, 182 and 183 are cut off, so there is substantially no current flow through the resistors R13, R15 and R17. At the same time, the MOS transistor 184 is turned on in response to the output signal from the CMOS inverter 185, so that the base of the Darlington pnp transistor 133 is coupled to the power source $V_{SS}$. For this reason, the potential at the emitter of the Darlington pnp transistor 133 becomes the same as that at the base thereof. As a result, the Darlington pnp transistor 133 is not turned on, so there is substantially no current flow therethrough.

In this circuit, when the power-down control signal PD is rendered active, steady currents do not flow between the power sources $V_{SS}$ and $V_{DD1}$ and between the power sources $V_{SS}$ and $V_{DD2}$. The power consumption of the circuit is decreased to a small amount caused by only the leakage current.

What we claim is:

1. A power amplifier circuit for amplifying an analog signal comprising:
   a signal input terminal for receiving an analog input signal;
   a signal output terminal for producing an analog output signal;
   a first power source for supplying a ground voltage;
   a second power source;
   a third power source;
   first and second resistors series-connected between said first and third power sources so as to obtain a reference voltage signal at a common node between said first and second resistors;
   a MOS differential amplifier comprising
     a differential amplification pair having a pair of MOS transistors gates which respectively receive the analog input signal corresponding to the analog input signal supplied to said signal input terminal and the reference voltage,
     a load circuit serving as a load for said differential amplification pair,
     a MOS current source transistor for supplying an operating current to said differential amplification pair, and
     a bias circuit for applying a gate bias voltage to said MOS current source transistor,
     said MOS differential amplifier having an output terminal connected to a common node between said differential amplification pair and said load circuit and being operated by a voltage falling within a range between voltages of said first and second power sources;
   a bipolar transistor driven by a signal from said output terminal of said MOS differential amplifier, so that one end of a collector-emitter path of said bipolar transistor is connected to said first power source and the other end thereof is connected to said signal output terminal;
   load means one end of which is connected to said signal output terminal and the other end of which is connected to said third power source;
   a third resistor inserted between said second power source and the common node between said first and second resistors so as to regulate DC voltage at said signal output terminal;

a fourth resistor inserted between said second power source and said MOS transistor of said differential amplification pair which receives the signal corresponding to the analog input signal, thereby regulating a DC voltage at said signal output terminal;

a power-down control signal input terminal;

controlling means for cutting off said MOS current source transistor by setting an output voltage of said bias circuit at a predetermined value when a power-down control signal is supplied to said power-down control signal input terminal;

a first MOS transistor a current path of which is inserted between a base of said bipolar transistor and said first power source, said first MOS transistor being turned on when the power-down control signal is supplied to said power-down control signal input terminal;

a second MOS transistor a current path of which is connected in series with said first resistor, said second MOS transistor being cut off when the power-down control signal is supplied to said power-down control signal input terminal;

a third MOS transistor a current path of which is connected in series with said third resistor, said third MOS transistor being cut off when the power-down control signal is supplied to said power-down control signal input terminal; and a fourth MOS transistor a current path of which is connected in series with said fourth resistor, said fourth MOS transistor being cut off when the power-down control signal is supplied to said power-down control input signal.

2. A power amplifier circuit for amplifying an analog signal comprising:

a signal input terminal for receiving an analog input signal;

a signal output terminal for producing an analog output signal;

a first power source for supplying a ground voltage;

a second power source;

a third power source;

first and second resistors series-connected between said first and third power sources so as to obtain a reference voltage signal at a common node between said first and second resistors;

a MOS differential amplifier having two input terminals and one output terminal, one of said two input terminals of said MOS differential amplifier receiving a signal corresponding to the analog input signal received at said signal input terminal, and the other of said two input terminals receiving the reference voltage signal;

a bipolar transistor driven by a signal from said output terminal of said MOS differential amplifier, one end of the collector-emitter path of said bipolar transistor connected to said first power source and the other end thereof connected to said signal output terminal;

load means one end of which is connected to said signal output terminal and the other end of which is connected to said third power source; and a third resistor inserted between said second power source and a common node between said first and second resistors so as to regulate a DC voltage at said signal output terminal.

3. A circuit according to claim 2, further comprising a fourth resistor inserted between said second power source and said one of said two input terminals of said MOS differential amplifier receiving the signal corresponding to the analog input signal received at said signal input terminal.

* * * * *